United States Patent
Shirotori et al.

(10) Patent No.: US 8,372,253 B2
(45) Date of Patent: Feb. 12, 2013

(54) PERPENDICULAR MAGNETIC RECORDING MEDIUM, METHOD OF MANUFACTURING THE SAME, AND MAGNETIC READ/WRITE APPARATUS

(75) Inventors: Satoshi Shirotori, Yokohama (JP); Yoshiyuki Kamata, Tokyo (JP); Takuya Shimada, Kawasaki (JP); Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 12/950,235

(22) Filed: Nov. 19, 2010

(65) Prior Publication Data
US 2011/0132754 A1 Jun. 9, 2011

(30) Foreign Application Priority Data
Dec. 7, 2009 (JP) .................. 2009-277858

(51) Int. Cl.
  *C25D 1/10* (2006.01)
  *B29D 17/00* (2006.01)
  *G11B 3/70* (2006.01)
(52) U.S. Cl. ............ 204/281; 204/280; 205/68; 205/70; 428/172; 430/296
(58) Field of Classification Search .................. 204/280, 204/281; 205/68, 70; 428/172; 430/296
  See application file for complete search history.

(56) References Cited

U.S. PATENT DOCUMENTS

| 5,277,783 | A | 1/1994 | Ohashi et al. |
| 6,748,865 | B2 | 6/2004 | Sakurai et al. |
| 2005/0063289 | A1* | 3/2005 | Tomiyama et al. ........ 369/270.1 |
| 2005/0138803 | A1 | 6/2005 | Okawa et al. |
| 2007/0151858 | A1* | 7/2007 | Moller et al. .................. 205/118 |
| 2009/0229857 | A1* | 9/2009 | Fredenberg et al. ....... 174/126.2 |
| 2009/0232928 | A1 | 9/2009 | Sugimura et al. |
| 2010/0213069 | A1* | 8/2010 | Kamata et al. .................. 205/68 |

FOREIGN PATENT DOCUMENTS

| JP | 02-312295 A | 12/1990 |
| JP | 04-338551 | 11/1992 |
| JP | 11-300755 | 11/1999 |
| JP | 2001-143331 A | 5/2001 |
| JP | 2003-157520 | 5/2003 |
| JP | 2003-277980 | 10/2003 |
| JP | 2005-133166 | 5/2005 |
| JP | 2006-077287 A | 3/2006 |
| JP | 2008-093960 A | 4/2008 |
| JP | 2009-084644 A | 4/2009 |

OTHER PUBLICATIONS

Notice of Reasons for Rejection mailed by Japan Patent Office on Feb. 1, 2011 in the corresponding Japanese patent application No. 2009-277858.

\* cited by examiner

*Primary Examiner* — Bruce Bell
(74) *Attorney, Agent, or Firm* — Knobbe, Martens, Olson & Bear, LLP (57) ABSTRACT

According to one embodiment, patterns of protrusions and recesses includes a substrate including a conductive region on at least one major surface, and a projecting pattern layer formed on the conductive region on the major surface, and made of a microcrystalline material, a polycrystalline material, an amorphous material, or an oxide of the microcrystalline, polycrystalline, or amorphous material.

6 Claims, 5 Drawing Sheets

PERPENDICULAR MAGNETIC RECORDING MEDIUM, METHOD OF MANUFACTURING THE SAME, AND MAGNETIC READ/WRITE APPARATUS

CROSS-REFERENCE TO RELATED APPLICATIONS

This application is based upon and claims the benefit of priority from Japanese Patent Application No. 2009-277858, filed Dec. 7, 2009; the entire contents of which are incorporated herein by reference.

FIELD

Embodiments described herein relate generally to a technique of manufacturing a magnetic recording medium having discrete tracks or bit patterns on the surface of a magnetic recording layer and, more particularly, to an electroforming master to be used when forming a mother stamper for duplicating a resin stamper for transferring a discrete track shape or bit pattern shape.

BACKGROUND

As the track density of an HDD increases in recent years, the problem of interference with an adjacent track is becoming serious. In particular, reducing side write due to the recording head magnetic field fringe effect is an important technical subject. A discrete track pattern medium (DTR medium) in which recording tracks are physically separated can reduce the side erase phenomenon that occurs during recording and the side read phenomenon by which information of an adjacent track mixes in during reproduction, thereby increasing the density in the cross track direction. This makes the DTR medium promising as a high-density magnetic recording medium. In addition, a bit patterned medium (BPM) physically divided in the bit direction as well has been proposed as a high-density magnetic recording medium capable of suppressing the medium noise and the thermal decay phenomenon by which recorded data disappears at room temperature.

Since the DTR medium and BPM are manufactured using the etching processing technique, the manufacturing cost may increase. Therefore, the following method has been proposed. That is, fine patterns obtained by EB (Electron Beam) lithography are transferred to a master, and an Ni stamper is duplicated from the master by electroforming. The Ni stamper is then set in an injection molding machine, and resin stampers are mass-produced by injection molding. The DTR media and BPM are manufactured by UV (UltraViolet-curing) imprinting using the resin stamper. This method can inexpensively mass-produce the DTR media and BPM. When patterns are downsized as the recording density increases, however, the ratio of the LER (Line Edge Roughness) to a master pattern increases in the manufacture of the pattern. Since the LER makes the recording density difficult to increase, demands have arisen for a method of suppressing the LER. On the DTR medium and BPM, not only information (a preamble, address, and burst) for positioning a read/write head but also recording tracks and recording bits are concentrically formed by EB lithography patterns that are transferred onto a master through an etching step. Since, however, an Si wafer conventionally used as the master is a single crystal and has etching anisotropy, the LER increases with respect to concentric patterns in portions different in crystallinity. To suppress the LER, an EB lithography resist can directly be used as the master. If an EB lithography resist pattern is directly used as the master, however, the resist pattern deforms due to the stress during electroforming. Therefore, a resist pattern cannot directly be used as the master when controlling a nanometer-order size. Also, a method of improving the linearity of a pattern by using an amorphous material as the pattern layer has been proposed. However, it is difficult to find an amorphous material by which fine patterns can be formed and to which conductivity can be given to such an extend that electroforming can be performed without any process gas damage.

To manufacture the DTR medium and BPM, it is common to transfer fine patterns whose size is $1/10$ or less that of patterns formed on optical disks. When the patterns are downsized as the recording density increases, however, it has become difficult to duplicate the Ni stamper from the master by electroforming. Since a Si wafer used as the master is made of a single crystal and has etching anisotropy, highly rectangular patterns are obtained. Also, the hardness of the Si wafer is higher than that of the Ni electroformed film. When separating the Ni electroformed film (father stamper) from the master, therefore, the electroformed film is pulled by the Si master in a place where the rectangularity is high, thereby forming a burr. In addition, when a conductive film for performing electroforming is deposited by sputtering, the openings of fine patterns are closed to form cavities (pores) because the deposition rate of pattern projections is higher than that of pattern recesses. Since no electroformed film is formed in master recesses, pattern transfer defects occur. Furthermore, when performing duplication by electroforming, the conductive film peels off in a portion where the adhesion between the conductive film and electroformed film is weak, thereby producing a level difference corresponding to the thickness of the conductive film. Since the unevenness of the patterns of protrusions and recesses height of the stamper leads to pattern formation defects when manufacturing the DTR medium and BPM, the on-track BER (Bit Error Rate) increases.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings.

In general, according to one embodiment, an electroforming master having patterns of protrusions and recesses formed on at least one major surface in accordance with information (a preamble, address, and burst) for positioning recording tracks or recording bits and a read/write head can be provided. The patterns of protrusions and recesses includes a substrate including a conductive region on at least one major surface, and a projecting pattern layer formed on the conductive region on the major surface, and made of a microcrystalline material, a polycrystalline material, an amorphous material, or an oxide of the microcrystalline, polycrystalline, or amorphous material.

Also, an electroforming master manufacturing method according to one embodiment is an example of a method of manufacturing the above-described electroforming master, and includes preparing a substrate including a conductive region on at least one major surface, and forming, on the major surface, a pattern formation layer made of a microcrystalline material, a polycrystalline material, an amorphous material, or an oxide of the microcrystalline, polycrystalline, or amorphous material, forming a mask layer on the pattern formation layer, coating the mask layer with an EB lithography resist having etching selectivity lower than that of the mask layer, thereby forming an EB lithography resist coating layer, writing information (a preamble, address, and burst) for positioning recording tracks or recording bits and a read/write head, on the EB lithography resist coating layer by using an EB lithography apparatus, and developing the information, thereby forming an EB lithography resist pattern, forming a mask pattern by etching the mask layer via the EB lithography resist pattern, forming a projecting pattern by partially etching away the pattern formation layer via the mask pattern, and removing the EB lithography resist pattern and the mask pattern by ashing.

In the embodiment, the projecting pattern layer is practically made of an amorphous material, a microcrystalline material, a polycrystalline material, or an oxide of the amorphous, microcrystalline, or polycrystalline material. When patterning the pattern formation layer, therefore, the line edge roughness (LER) is made much lower than that of a projecting portion formed by patterning a single-crystal Si film. Accordingly, the master of the embodiment has patterns of protrusions and recesses having a low line edge roughness (LER). Also, the use of the master of the embodiment makes it possible to transfer fine patterns, and suppress uneven separation after electroforming.

The substrate including the conductive region on at least one major surface is obtained by forming a conductive layer on the substrate.

The patterns of protrusions and recesses layer can contain at least one material selected from the group consisting of microcrystalline, polycrystalline, and amorphous materials of Si and Ti, and oxides of these materials. According to an aspect of the embodiment, the patterns of protrusions and recesses layer is made of at least one material selected from the group.

The conductive region can be made of, e.g., a material formed on one major surface of a substrate, and selected from the group consisting of platinum, gold, palladium, ruthenium, copper, and alloys of these metals.

The embodiment will be explained in more detail below with reference to the accompanying drawings.

FIGS. 1A, 1B, 1C, 1D, 1E, and 1F are views showing an example of a method of manufacturing the master according to the embodiment.

(Conductive Layer Formation Step)

Figure 1A:
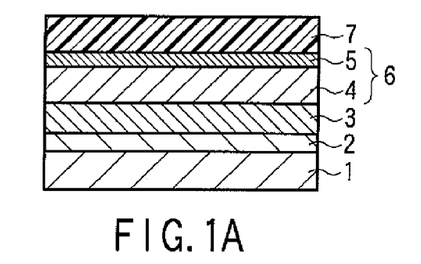
FIGS. 1A, 1B, 1C, 1D, 1E, and 1F are views showing an example of a method of manufacturing a master according to an embodiment.

First, as shown in FIG. 1A, an Si substrate 6 inches in diameter was prepared as a substrate 1, and a conductive layer 2 was formed on the substrate 1. The Si substrate has, e.g., crystal orientation (100). The conductive layer 2 can be formed to have a thickness of 20 nm by using Ru by applying a power of DC 500 W by sputtering at a pressure of 0.6 Pa. As the conductive layer 2, it is possible to use a material having an etching resistance against reactive ion etching (RIE) using a fluorine-based gas and oxygen gas. The material is not limited to Ru as long as the material has a low electrical resistance. Examples of the conductive layer material are metal materials such as Fe, Co, Ni, Ru, Pt, Au, Ag, Pd, Cu, Ti, Ta, and W. It is more favorable to use Ru, Pt, Au, Pd, or Cu having an RIE resistance and a low roughness after deposition. The deposition method is physical vapor deposition or chemical vapor deposition. The film thickness of the conductive layer can be 2 to 50 nm. If the film thickness is less than 2 nm, it is often impossible to obtain a uniform film. If the film thickness exceeds 50 nm, the roughness tends to increase.

(Pattern Layer Formation Step)

A pattern formation layer 3 was formed on the conductive layer 2. The pattern formation layer 3 was formed to have a thickness of 40 nm by using Si at DC 200 W and 0.6 Pa by sputtering. The etching selectivity of the pattern formation layer 3 can be made higher than that of a mask layer 6 to be formed next. "The etching selectivity is high (or low)" means that the etching rate is higher (or lower) than that of the mask layer 6 under the same etching conditions. When using a fluorine-based gas, the RIE rate of Si of the pattern formation layer 3 is higher than that of C of the mask layer 6. The film thickness of the pattern formation layer 3 is the patterns of protrusions and recesses height of a master 10, and hence is not particularly limited as it is equal to the target patterns of protrusions and recesses height. When depositing the pattern formation layer 3 on the conductive layer 2 by physical vapor deposition or chemical vapor deposition, amorphous Si or microcrystalline Si (microcrystalline silicon or polysilicon) is obtained. An oxide such as $SiO_2$ as an amorphous material may also be used as the pattern formation layer 3. Similar to Si, the RIE rate of Ti is higher than that of a C mask layer 4 when using a fluorine-based gas, so it is possible to use amorphous Ti, microcrystalline Ti, polycrystalline Ti, or Ti oxide. Consequently, the pattern of the embodiment capable of suppressing the LER can be obtained.

Although the film thickness of the pattern formation layer 3 depends on the pattern size to be formed, the film thickness can be 2 to 50 nm. If the film thickness is less than 2 nm, no uniform film can be obtained. If the pattern height is small, it is often impossible to obtain the effect of a mask after transfer. The embodiment assumes that the electroforming master has a pattern size of, e.g., a few nm to 100 nm. If the thickness of the pattern formation layer exceeds 50 nm, therefore, the aspect ratio increases and tends to cause pattern collapse.

Also, when the pattern recess surface is made of the conductive layer 2, an adhesive layer (not shown) can be formed as a part of the pattern formation layer 3, between the pattern formation layer 3 and conductive layer 2. Examples of the adhesion layer are metal materials such as Ti, Ni, and Cr and their alloys.

(Mask Layer Formation Step)

The mask layer 6 was formed on the pattern formation layer 3. The etching selectivity of the mask layer 6 can be made higher than that of an EB lithography resist and lower than that of the Si substrate. The number of layers and the material of the mask layer are not particularly limited. "The etching selectivity is high" means that the etching rate is higher than that of an EB lithography resist under the same etching conditions. A multilayered structure can be used to simply perform etching by using a fluorine-based gas or oxygen gas. A mask having a high aspect ratio can be formed by respectively using Si and C as a mask layer 5 and the mask layer 4. The Si layer is deposited by 3 nm and the C layer is deposited by 40 nm at, e.g., DC 200 W and 0.6 Pa. Si of the mask layer 5 has an RIE rate higher than that of an EB lithography resist when using a fluorine-based gas. C of the mask layer 4 has an RIE rate higher than that of Si of the mask layer 5 when using oxygen gas. The deposition method is physical vapor deposition or chemical vapor deposition. If the thickness of the mask layer 6 is 2 nm or less, no uniform film can be obtained. If the thickness of the mask layer 6 exceeds 50 nm, the roughness increases. Accordingly, the thickness of the mask layer 6 can be 2 (inclusive) to 50 (inclusive) nm. Since, however, a thickness with which the mask layer 6 can withstand desired etching, the thickness is selected in accordance with the etching selectivity of the material.

(Resist Patterning Step)

Resist ZEP-520A available from ZEON was diluted to twice the volume with anisole, and the solution was filtered through a 0.05-μm filter. The substrate was spin-coated with the resist solution and prebaked at 200° C. for 3 min, thereby forming a resist layer about 30 nm thick. After that, the resist layer was removed from the edge portion serving as an electrode in electroforming (see FIG. 2).

Figure 2:
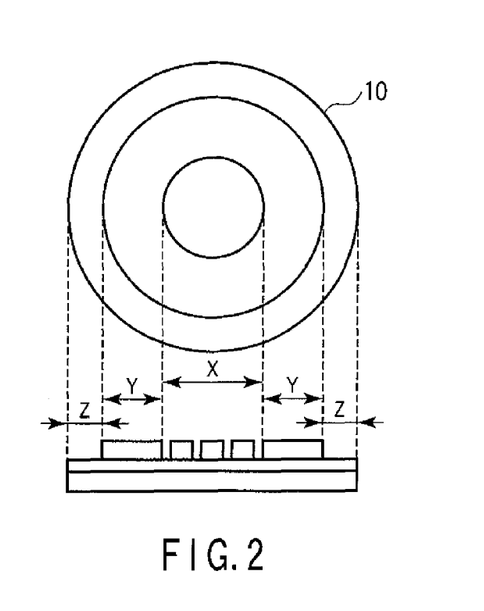
FIG. 2 is a front view of the master.

FIG. 2 is a front view of the master according to the embodiment.

As shown in FIG. 2, the master 10 according to the embodiment is divided into three areas, i.e., a pattern area X, mirror area Y, and edge rinse area Z.

Subsequently, an electron beam lithography apparatus 15 having a ZrO/W thermal field emission type electron gun emitter was used to directly write desired patterns on the resist on the substrate at an acceleration voltage of 50 kV. This lithography was performed using a signal source that synchronously generates a signal for forming a servo pattern, burst pattern, address pattern, and track pattern (or bit pattern) (see FIGS. 3 and 4), a signal to be supplied to a stage driving system (a so-called X-θ stage driving system including a rotating mechanism and a moving mechanism having a moving axis in at least one direction) of the lithography apparatus, and an electron beam deflection control signal. During the lithography, the stage was rotated at a CLV (Constant Linear Velocity) of 500 mm/s, and moved in the radial direction as well. Also, concentric track areas were written by deflecting the electron beam for every rotation. Note that the feeding speed was 7.8 nm per rotation, and one track (equivalent to one address bit width) was formed by ten rotations.

Figure 3:
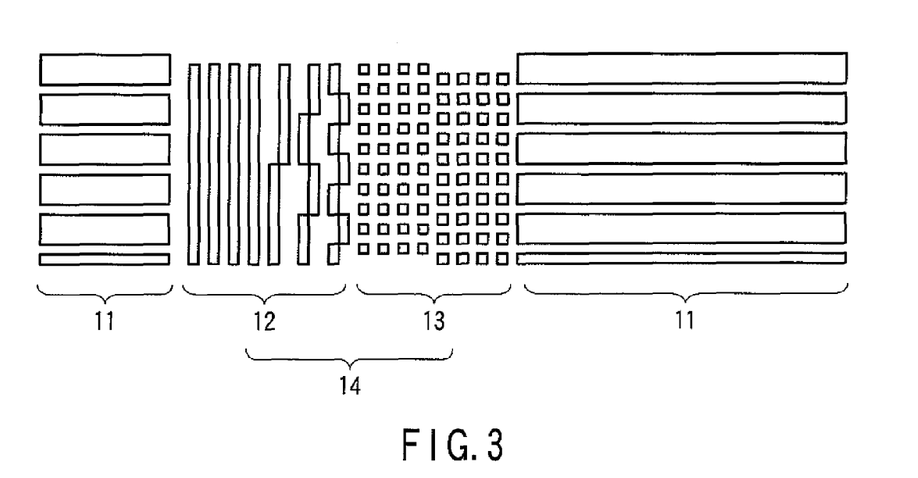
FIG. 3 is a front view showing an example of patterns of protrusions and recesses recording information for positioning recording tracks and a read/write head.
Figure 4:
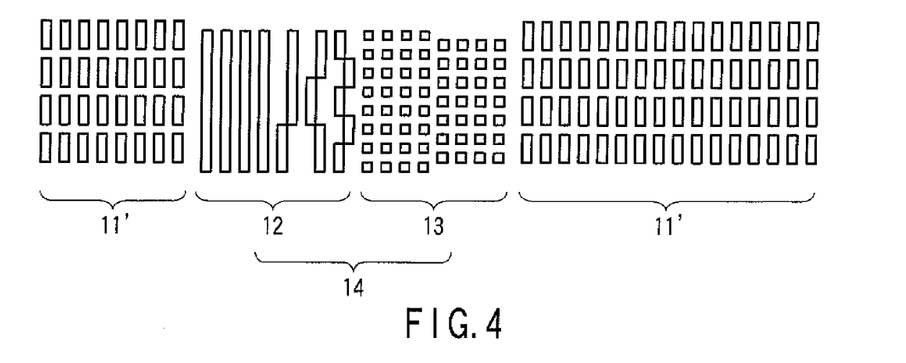
FIG. 4 is a front view showing an example of patterns of protrusions and recesses of information for positioning recording bits and a read/write head.

FIG. 3 is a front view showing an example of patterns of protrusions and recesses recording information for positioning recording tracks and a read/write head. FIG. 4 is a front view showing an example of patterns of protrusions and recesses of information for positioning recording bits and a read/write head.

Examples of the lithography pattern described above are a pattern corresponding to a track pattern 11 formed in a data area and a servo area pattern 14 including a preamble address pattern 12 and burst pattern 13 formed in a servo area, as shown in FIG. 3, and a pattern corresponding to a bit pattern 11' formed in a data area and a servo area pattern 14 including a preamble address pattern 12 and burst pattern 13 formed in a servo area, as shown in FIG. 4.

Figure 1B:
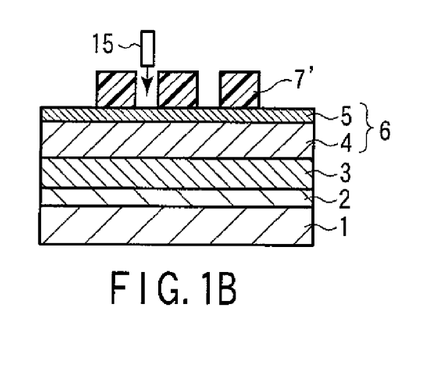

Subsequently, the resist was developed by dipping the substrate in developer ZED-N50 (available from ZEON) for 90 sec. After that, the substrate was rinsed as it was dipped in ZMD-B (available from ZEON) for 90 sec, and dried by air blow, and resist patterns 7' were obtained by resist patterning (FIG. 1B).

(Etching Step)

Figure 1C:
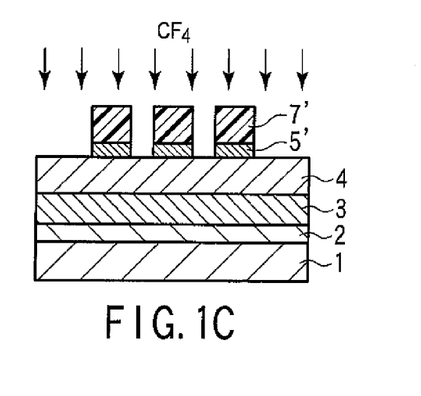
Figure 1D:
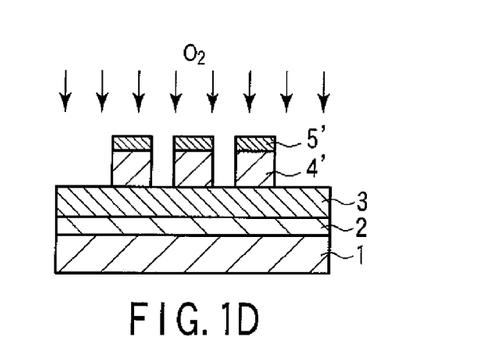
Figure 1E:
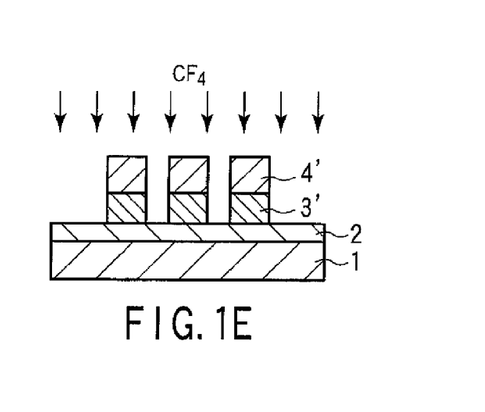

Based on the resist patterns 7', Si of the mask layer 5 is etched by using an ICP etching apparatus. For example, mask patterns 5' are obtained by etching Si of the mask layer 5 by using $CF_4$ as a process gas at a chamber pressure of 0.1 Pa, an antenna power of 100 W, and a bias power of 5 W (FIG. 1C). Then, C of the mask layer 4 is etched with oxygen gas based on the mask patterns 5'. For example, mask patterns 4' are obtained by etching C of the mask layer 4 by using $O_2$ as a process gas at a chamber pressure of 0.1 Pa, an antenna power of 100 W, and a bias power of 5 W. This process simultaneously removes the EB lithography resist patterns 7' (FIG. 1D). Si of the pattern formation layer 3 is then etched based on the mask patterns 4'. For example, polycrystalline projecting patterns 3' can be formed by partially etching Si of the pattern layer 3 by using $CF_4$ as a process gas at a chamber pressure of 0.1 Pa, an antenna power of 100 W, and a bias power of 5 W. This process simultaneously removes Si of the mask patterns 5' (FIG. 1E).

(Ashing Step)

Figure 1F:
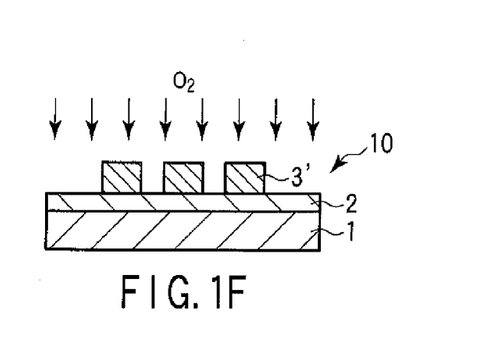

C of the mask patterns 4' is removed with oxygen gas by using the ICP etching apparatus. For example, C of the mask patterns 4' can be removed by using $O_2$ as a process gas at a chamber pressure of 0.1 Pa, an antenna power of 400 W, and a bias power of 0 W. In this manner, projecting patterns made of polycrystalline Si are formed on the single-crystal Si substrate, thereby obtaining a master having the pattern recess surface made of the conductive layer (FIG. 1F).

Note that it is readily possible to confirm that the projecting patterns made of Si are polycrystalline by, e.g., a rocking curve measurement method using X-ray diffraction.

Mother Stamper Manufacturing Method

A mother stamper manufacturing method using the master of the embodiment will be explained below with reference to FIGS. 5A, 5B, 5C, 5D, 5E, and 5F.

Figure 5A:
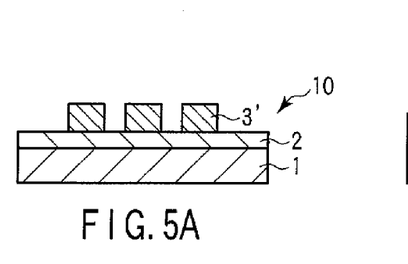
FIGS. 5A, 5B, 5C, 5D, 5E, and 5F are views showing a mother stamper manufacturing method using the master of the embodiment.
Figure 5B:
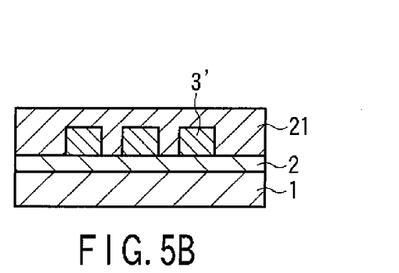

As shown in FIG. 5A, an electrode is formed by inserting a conductive ring (not shown) into the edge rinse area Z as an electrode portion of the master 10. Ni electroforming is performed for 90 min by dipping the master 10 in a nickel sulfamate plating solution (NS-160 available from Showa Chemical Industry), thereby forming an electroformed film 21 about 300 μm thick as shown in FIG. 5B. The electroforming bath conditions are as follows.

Figure 5C:
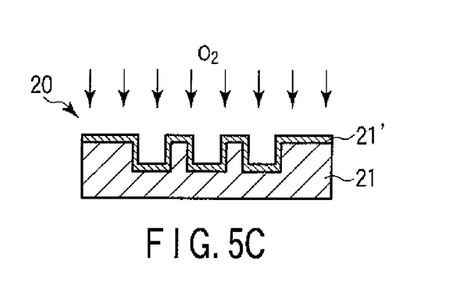
Figure 5D:
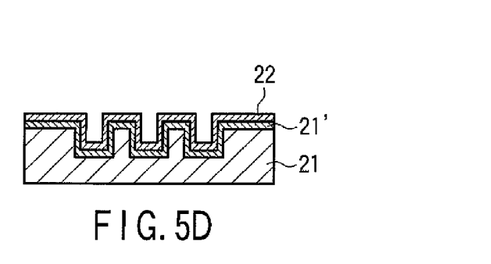
Figure 5E:
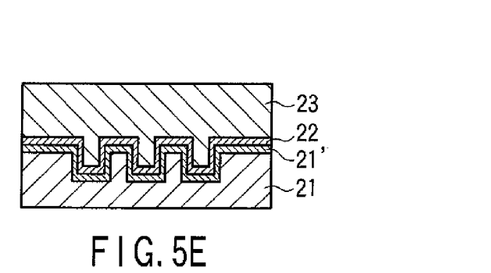
Figure 5F:
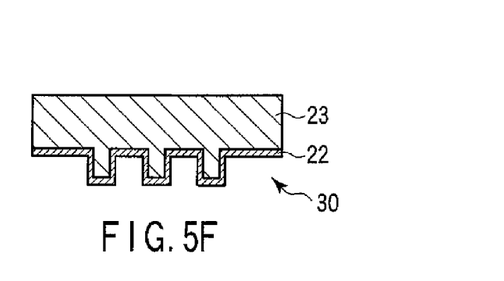

Nickel sulfamate: 600 g/L
Boric acid: 40 g/L
Surfactant (sodium lauryl sulfate): 0.15 g/L
Solution temperature: 55° C.
pH: 4.0
Current density: 20 A/dm$^2$ Subsequently, the electroformed film is separated from the master. The stamper manufactured as described above will be called a father stamper 20. The master 10 and father stamper 20 can be separated from each other from the electroforming surface. After that, a passivation process is performed on the surface of the Ni stamper by oxygen RIE (Reactive Ion Etching), thereby oxidizing the surface and forming an oxide film as shown in FIG. 5C. More specifically, oxygen RIE was performed for 3 min by applying a power of 100 W into a chamber in which the pressure was adjusted to 4 Pa by supplying oxygen gas at 100 mL/min. After that, a conductive film 22 is deposited on the surface by sputtering as shown in FIG. 5D, and an electroformed film 23 is formed by performing electroforming under the same conditions as the above-mentioned electroforming bath conditions as shown in FIG. 5E. As shown in FIG. 5F, a mother stamper 30 is obtained by separating the electroformed film 23 and conductive film 22 from the father stamper 20. The father stamper 20 and mother stamper 30 can be separated from each other from the oxide layer 21.

After that, the inner and outer diameters of the stamper are punched before lower-surface polishing is performed. After the upper surface of the stamper was coated with a protective film (trade name: Silitect), the stamper was set in a punching apparatus (SIBERT OMICRON), a ring-like metal blade having an outer diameter of 75 mm and an inner diameter of 7 mm was centered such that the center of the blade was aligned with the center of the pattern formed on the stamper, and punching was performed. The punched stamper was polished so that the lower surface became a mirror surface. "Mirror surface polishing" herein mentioned is on a level capable of light reflection, and the surface roughness (Ra) can be about 50 nm or less.

Magnetic Recording Medium Manufacturing Method

A method of manufacturing a DTR medium and BPM will be explained below with reference to FIGS. 6A, 6B, 6C, 6D, 6E, 6F, 6G, 6H, and 6I.

Figure 6A:
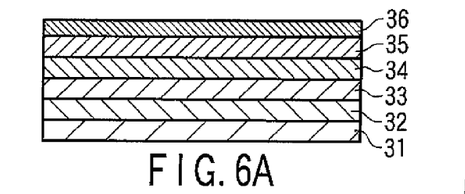
FIGS. 6A, 6B, 6C, 6D, 6E, 6F, 6G, 6H, and 6I are views for explaining an example of a method of manufacturing a DTR medium.

First, the Ni stamper manufactured by the method explained with reference to FIGS. 1A, 1B, 1C, 1D, 1E, 1F, 2, 3, 4, 5A, 5B, 5C, 5D, 5E, and 5F is set in an injection molding apparatus (manufactured by TOSHIBA MACHINE), and a resin stamper is manufactured. Although the molding material is cyclic olefin polymer ZEONOR 1060R available from ZEON, polycarbonate material AD5503 available from TEIJIN CHEMICALS may also be used. After that, as shown in FIG. 6A, a 120-nm thick soft magnetic layer 32 (CoZrNb), 20-nm thick orientation controlling underlayer 33 (Ru), 15-nm thick ferromagnetic recording layer 34 (CoCrPt—$SiO_2$), and 15-nm thick protective layer 35 (C) are sequentially deposited on a glass substrate 31. A metal layer 36 (3 to 5 nm) is deposited on the protective layer 35. A metal used as the metal layer 36 is a material having high adhesion to a 2P (photopolymer) agent, and completely removable by etching using He+$N_2$ gas in a step shown in FIG. 6G. Practical examples are CoPt, Cu, Al, NiTa, Ta, Ti, Si, Cr, NiNb, and ZrTi. Of these materials, CoPt, Cu, and Si are particularly superior in balance between the 2P agent adhesion and the removability by He+$N_2$ gas.

Note that the 2P agent is an ultraviolet-curing material made of a monomer, oligomer, and polymerization initiator, and does not contain any solvent.

Figure 6B:
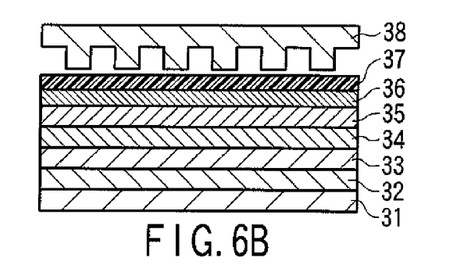
Figure 6C:
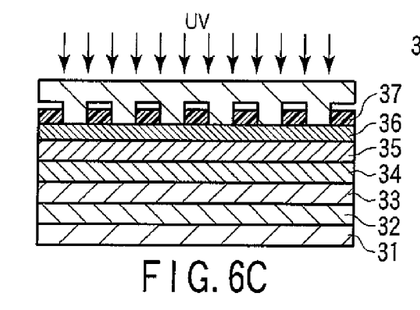

As shown in FIG. 6B, a UV-curing resin layer 37 is formed by spin-coating the metal layer 36 with a 50-nm thick photopolymer (2P) agent. The 2P agent is an ultraviolet-curing material made of a monomer, oligomer, and polymerization initiator. An example is a material containing isobornyl acrylate (IBOA) as a monomer, polyurethane diacrylate (PUDA) as an oligomer, and DAROCUR 1173 as a polymerization initiator, such that the contents of IBOA, PUDA, and the polymerization initiator are respectively 85%, 10%, and 5%. After that, a resin stamper 38 described above is used to perform imprinting on the UV-curing resin layer 37 (FIG. 6C).

Figure 6D:
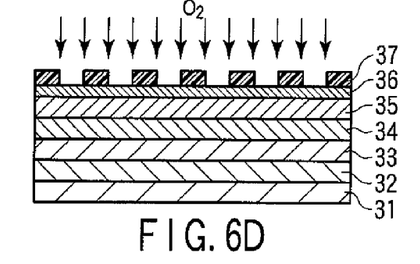

Subsequently, oxygen gas is used to remove the imprinting residue by using an ICP etching apparatus. For example, the residue formed by the imprinting process is removed by using oxygen as a process gas at a chamber pressure of 2 mTorr, a coil RF of 100 W, and a platen RF of 100 W for an etching time of 30 sec (FIG. 6D).

Figure 6E:
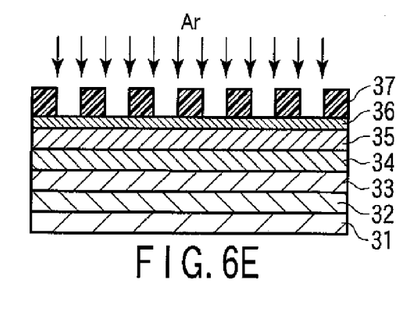

The metal layer 36 is then etched by ion beam etching using Ar gas (FIG. 6E). This step is not always necessary and may be omitted. For example, the metal layer 36 can also be etched by increasing the anisotropy (e.g., increasing the platen RF of the ICP conditions to about 300 W) in the imprinting residue removing step (FIG. 6D). When using Si as the metal layer 36, ion beam etching using $CF_4$ gas can also be used.

In the imprinting residue removing step, the resist residue is removed by RIE (Reactive Ion Etching). The plasma source can be an ICP (Inductively Coupled Plasma) that can be generated with a high density at a low pressure. However, it is also possible to use an ECR (Electron Cyclotron Resonance) plasma or a general parallel-plate RIE apparatus. Oxygen gas can be used as the 2P agent.

Figure 6F:
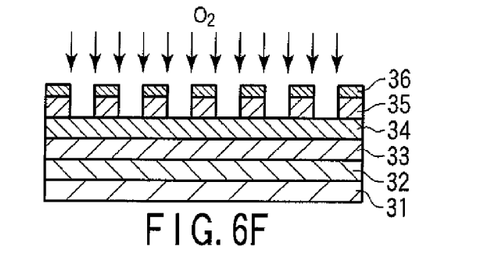

After that, the protective layer 35 is etched by the ICP etching apparatus by using oxygen gas. A C mask is then formed by using oxygen as a process gas at a chamber pressure of 2 mTorr, a coil RF of 100 W, and a platen RF of 100 W for an etching time of 30 sec (FIG. 6F).

Figure 6G:
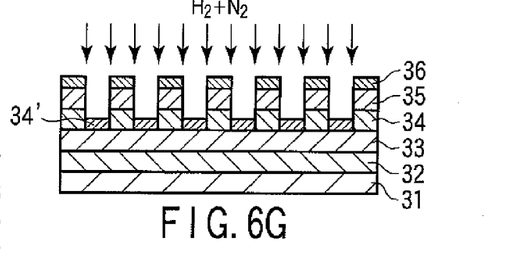

Ion beam etching is performed through the formed C mask by using He or He+$N_2$ (the mixing ratio is 1:1) (FIG. 6G). ECR can be used in the ionization of the gas. For example, etching is performed at a microwave power of 800 W and an acceleration voltage of 1,000 V for 20 sec, thereby forming a 10-nm thick patterns of protrusions and recesses that partially divides the ferromagnetic recording layer 34. A 5-nm thick residue of the ferromagnetic recording layer 34 deactivates the magnetism owing to the effect of the exposure to He+$N_2$, thereby forming a magnetism-deactivated layer 34'.

In this step, it is important to completely remove the metal layer 36 (e.g., Cu) formed in the step shown in FIG. 6A at the same time. This is so because if the metal layer 36 remains, the C mask protected by the metal layer cannot be removed in the next C mask removing step performed by RIE using oxygen gas.

Figure 6H:
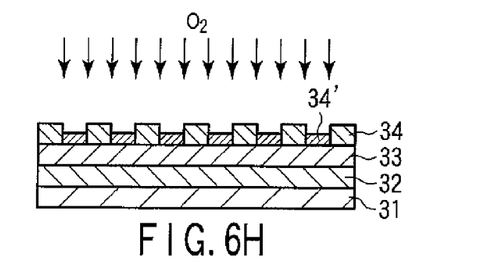
Figure 6I:
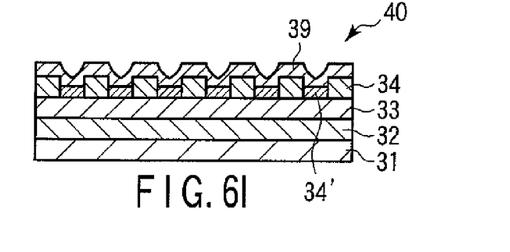

After that, the C mask is removed by RIE using oxygen gas at 100 mTorr and 100 W for an etching time of 30 sec (FIG. 6H). It is also possible to readily remove the C mask by oxygen plasma processing. In this step, a carbon protective layer on the surface of a perpendicular magnetic medium is also removed.

Finally, a 4-nm thick surface C protective film 39 is formed by CVD (FIG. 6I) and coated with a lubricant, thereby obtaining a DTR medium 40 or BPM.

The C protective film is desirably deposited by CVD in order to improve the coverage to the patterns of protrusions and recesses. However, the C protective film may also be deposited by sputtering or vacuum deposition. When forming the C protective film by CVD, a DLC film containing a large amount of $sp^3$-bonded carbon is formed. If the film thickness is 2 nm or less, the coverage worsens. If the film thickness is 10 nm or more, the magnetic spacing between a read/write head and the medium increases, and this often decreases the SNR. A lubricating layer can also be formed on the protective layer. As a lubricant for use in the lubricating layer, it is possible to use a conventionally known material, e.g., perfluoropolyether, alcohol fluoride, or fluorinated carboxylic acid.

When patterns of protrusions and recessess are directly formed on a single-crystal Si substrate, crystal anisotropy for etching occurs: in concentrically written patterns, the LER increases in a portion where the pattern direction and crystal direction are different. In the embodiment, however, the conductive layer, pattern layer, and mask layer are deposited by, e.g., physical vapor deposition or chemical vapor deposition, and an Si layer made of amorphous Si or microcrystalline Si (microcrystalline silicon or polysilicon) is used as the patterns of protrusions and recesses. Therefore, the crystal anisotropy for etching is suppressed, and the pattern of the embodiment capable of suppressing the LER can be obtained.

Also, when using the master manufactured by the method of the embodiment, it is possible to electroform patterns finer than those which can be electroformed by using a master manufactured by the conventional method.

In addition, the use of the master manufactured by the method of the embodiment effectively suppresses uneven separation when duplicating a mother stamper. In the embodiment, the father stamper is made of only an electroformed film. Accordingly, no uneven separation occurs unlike when, e.g., a father stamper is formed using an electroformed film and conductive film.

EXAMPLES

Example 1

Formation Example of Master

A master was manufactured by the method shown in FIGS. 1A, 1B, 1C, 1D, 1E, and 1F. Ru, Si, Si, and C were respectively used as the conductive layer, pattern layer, mask layer 5, and mask layer 4. When the LER of the manufactured master was measured, the LER was 3.1 nm, i.e., the master had a favorable LER. The LER was measured by extracting an edge line within a range of 1 μm×1 μm from an SEM (Scanning Electron Microscope) image of a track portion that made an angle of 45° with the cleavage surface of the Si substrate, and defining 3σ of the edge change amount as the LER. Also, X-ray diffraction was used to evaluate the crystal orientation of Si by the half-width ($\Delta\theta 50$) of a rocking curve. Consequently, the $\Delta\theta 50$ was 2.4°, i.e., Si was polycrystalline.

Comparative Example 1

Formation Example of Three-Dimensional Master of Si Substrate

A mask layer was deposited without depositing any conductive layer and pattern layer, and coated with an EB lithography resist. After patterning was performed, a master was manufactured by transferring the patterns of protrusions and recesses onto an Si substrate.

When the LER was measured by the same method as in Example 1, the LER of the conventional example was 6.1 nm. Also, the $\Delta\theta 50$ was 0.1°, i.e., Si was a single crystal.

Example 2

Example in Which Conductive Layers of Masters Were Au, Pt, Pd, and Cu

Masters are manufactured following the same procedures as in Example 1. Si, Si, and C were respectively used as the pattern layer, mask layer 1, and mask layer 2 as in Example 1, and Au, Pt, Pd, and Cu were used as the conductive layers.

The LER of each of the manufactured masters was measured by the same method as in Example 1. Consequently, the values of the LER were 3.9, 4.0, 3.9, and 3.1 nm when using Au, Pt, Pd, and Cu, respectively, as the conductive layers. That is, each LER improved from that of Comparative Example 1.

Also, the values of the $\Delta\theta 50$ were 3.4°, 3.2°, 2.9°, and 2.5° when using Au, Pt, Pd, and Cu, respectively, as the conductive layers. This demonstrates that when the conductive layer was formed, a single-crystal Si substrate having a small orientation dispersion angle changed into polycrystalline Si regardless of the material of the conductive layer. Table 1 shows the result.

TABLE 1

|  | Comparative Example | Example | | | | |
|---|---|---|---|---|---|---|
|  | 1 | 1 (Ru) | 2 (Au) | 2 (Pt) | 2 (Pd) | 2 (Cu) |
| LER (nm) | 6.1 | 3.1 | 3.9 | 4.0 | 3.9 | 3.1 |
| $\Delta\theta 50$ (degree) | 0.1 | 2.4 | 3.4 | 3.2 | 2.9 | 2.5 |

Example 3

Formation Example of Masters in Which Conductive Layers Were Ru, Au, Pd, and Cu and Father Stampers Masters were manufactured following the same procedures as in Example 1. Si, Si, and C were respectively used as the pattern layer, mask layer 5, and mask layer 4 as in Example 1, and Ru, Au, Pt, Pd, Cu, Ni, Ti, Fe, Co, Ta, W, and C were used as the conductive layers. The film resistance of the conductive layer portion (the edge rinse portion shown in FIG. 4) of each manufactured master was measured by a four-point probe method, and the resistivity was calculated by using the film thickness of the conductive layer and a correction coefficient RCF (Resistivity Correction Factor). Subsequently, father stampers were manufactured by the method shown in FIGS. 5A, 5B, 5C, 5D, 5E, and 5F. When using C as the conductive layer, the resistance was high, and no resistance value was obtained by the four-point probe method, i.e., it was impossible to obtain conductivity high enough to perform electroforming. When using any of Ni, Ti, Fe, Co, Ta, and W as the conductive layer, the resistivity was 10 to the −3rd power, so electroforming was possible, but the pattern of the father stamper partially broke. This is so presumably because the resistivity of the material itself was low, and the material oxidized when forming the master. On the other hand, when using any of Ru, Au, Pt, Pd, and Cu as the conductive layer, the resistivity was on the order of $10^{-4}$, and duplication by electroforming was also possible. Table 2 shows the result.

TABLE 2

| Conductive layer | Ru | Au | Pt | Pd | Cu | Ni | Ti | Fe | Co | Ta | W | C |
|---|---|---|---|---|---|---|---|---|---|---|---|---|
| Resistivity (Ω cm) | $2 \times 10^{-4}$ | $1 \times 10^{-4}$ | $1 \times 10^{-4}$ | $2 \times 10^{-4}$ | $5 \times 10^{-4}$ | $5 \times 10^{-3}$ | $7 \times 10^{-3}$ | $7 \times 10^{-3}$ | $7 \times 10^{-3}$ | $3 \times 10^{-3}$ | $4 \times 10^{-3}$ | – |
| Possibility of electroforming | ○ | ○ | ○ | ○ | ○ | Δ | Δ | Δ | Δ | Δ | Δ | × |

Example 4

Masters (Patterns of protrusions and recesses Height=5 nm, Fine Patterns) and Father Stampers Masters were manufactured following the same procedures as in Example 1, and subsequently father stampers were manufactured by the method shown in FIGS. 5A, 5B, 5C, 5D, 5E, and 5F. The masters were prepared by setting the master patterns of protrusions and recesses height at 5 nm, and changing the groove width to 3, 7, 10, 15, 20, 25, and 30 nm. When using the masters of the embodiment, it was possible to perform duplication by electroforming even when the groove width was 3 nm.

Example 5

Formation Example of Masters (Patterns of protrusions and recesses Height=40 nm, Fine Patterns) and Father Stampers Masters were manufactured following the same procedures as in Example 4 except that the master patterns of protrusions and recesses height was set at 40 nm, and subsequently father stampers were manufactured by the method shown in FIGS. 5A, 5B, 5C, 5D, 5E, and 5F. The masters were prepared by holding the patterns of protrusions and recesses height at 40 nm, and changing the groove width to 3, 7, 10, 15, 20, 25, and 30 nm. When using the masters of the embodiment, it was possible to perform duplication by electroforming with patterns having a groove width of 3 nm, even when the patterns of protrusions and recesses height was as large as 40 nm.

Comparative Example 2

Masters Having No Conductive Layer and Father Stampers Using Conductive Film Sputtering To give the master of Comparative Example 1 electrical characteristics for performing electroforming, Ni was deposited as a conductive film. After that, the master was dipped in a nickel sulfamate plating solution, and Ni electroforming was performed for 90 min, thereby forming an electroformed film about 300 µm thick. Subsequently, the electroformed film was peeled from the master, thereby manufacturing a father stamper.

Masters were prepared by holding the patterns of protrusions and recesses height at 40 nm, and changing the groove width to 3, 7, 10, 15, 20, 25, and 30 nm. When the groove width was 20 nm or less, pores formed, and the patterns of protrusions and recesses height decreased after electroforming. This demonstrates that duplication by electroforming was impossible.

Figure 7:
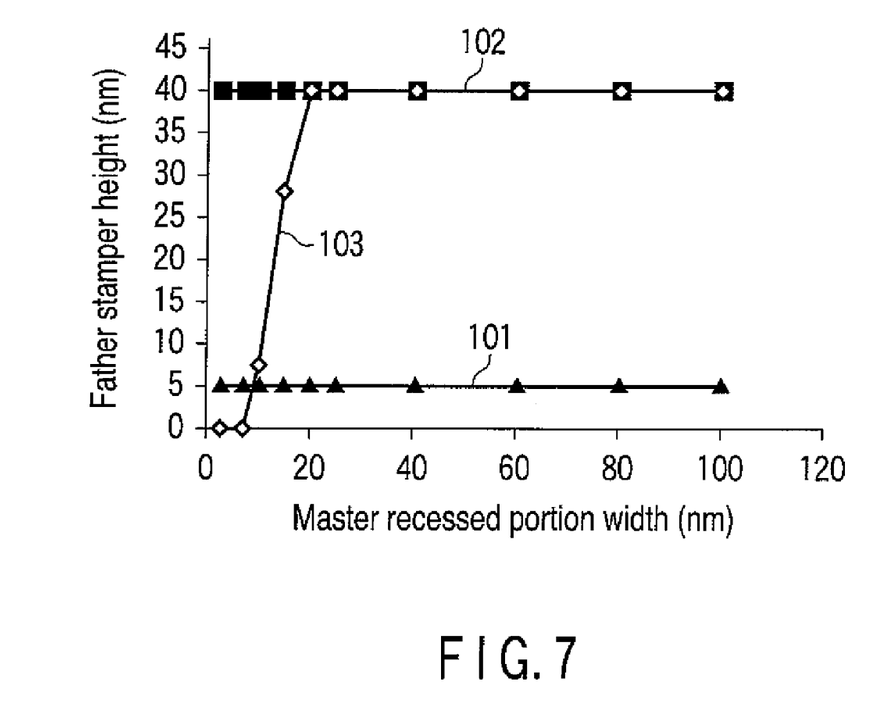
FIG. 7 is a graph showing the relationship between the patterns of protrusions and recesses height after electroforming and the master groove width.

FIG. 7 shows the results obtained by Examples 4 and 5 and Comparative Example 2.

FIG. 7 is a graph showing the relationship between the patterns of protrusions and recesses height after electroforming and the master groove width.

In FIG. 7, reference numerals 101, 102, and 103 respectively denote Example 4, Example 5, and Comparative Example 2.

Example 6

Formation Example of Master and Mother Stamper

A master was manufactured following the same procedures as in Example 1, and subsequently a mother stamper was manufactured by the method shown in FIGS. 5A, 5B, 5C, 5D, 5E, and 5F.

For comparison, the surface of the father stamper of Comparative Example 2 was oxidized by oxygen RIE, and a conductive film was deposited on the surface by sputtering and electroformed, thereby obtaining a mother stamper.

When a surface optical test was conducted by using Micro-MAX (manufactured by VISION PSYTEC), uneven patterns were found here and there in the comparative example. When the uneven portions were observed with an AFM (Atomic Force Microscope), the patterns of protrusions and recesses height increased by the thickness of the conductive film. On the other hand, the mother stamper using the master of the embodiment had no patterns of protrusions and recesses height unevenness.

Example 7

Formation Example of Master and DTR Medium

A DTR medium was manufactured using the master obtained in Example 1. The master patterns had a track pitch of 75 nm and a groove width of 25 nm, i.e., had the same shape. After that, a mother stamper was manufactured through the steps shown in FIGS. 5A, 5B, 5C, 5D, 5E, and 5F, and a DTR medium was manufactured through the steps shown in FIGS. 6A, 6B, 6C, 6D, 6E, 6F, 6G, 6H, and 6I. Cyclic olefin polymer ZEONOR 1060R available from ZEON was used as the molding material. A medium shown in FIG. 6A was obtained by sequentially depositing a 120-nm thick soft magnetic layer (CoZrNb), 20-nm thick orientation controlling underlayer (Ru), 15-nm thick ferromagnetic recording layer (CoCrPt—$SiO_2$), and 15-nm thick protective layer (C) on a glass substrate, and 3-nm thick Cu was deposited as a metal layer on the protective layer in order to increase the adhesion to a 2P agent. After that, as shown in FIG. 6C, the metal layer was spin-coated with a 50-nm thick 2P agent, and UV imprinting was performed using the resin stamper described previously. Subsequently, as shown in FIG. 6D, the residue formed by the imprinting process was removed by using oxygen gas at a chamber pressure of 2 mTorr, a coil RF of 100 W, and a platen RF of 100 W for an etching time of 30 sec. The metal layer was then etched by ion beam etching using Ar gas as shown in FIG. 6E. After that, as shown in FIG. 6F, the protective layer (C) was etched by the ICP etching apparatus by using oxygen gas. A C mask was formed by using oxygen as a process gas at a chamber pressure of 2 mTorr, a coil RF of 100 W, and a platen RF of 100 W for an etching time of 30 sec. Ion beam etching was performed through the formed C mask by using He+$N_2$ (the mixing ratio was 1:1) (FIG. 6G). ECR was used in the ionization of the gas, and etching was performed at a microwave power of 800 W and an acceleration voltage of 1,000 V for 20 sec, thereby forming a 10-nm thick patterns of protrusions and recesses that partially divided the ferromagnetic recording layer. A 5-nm thick residue of the ferromagnetic recording layer deactivated the magnetism owing to the effect of the exposure to He+$N_2$. At the same time, the metal layer (Cu) deposited in the step shown in FIG. 6A was completely removed. After that, the C mask was removed by RIE using oxygen gas at 100 mTorr and 100 W for an etching time of 30 sec (FIG. 6H), and a 4-nm thick surface C protective film was formed by CVD (FIG. 6I) and coated with a lubricant, thereby obtaining a DTR medium.

The manufactured DTR medium had a track pitch of 75 nm, a recording track width of 50 nm, and a groove width of 25 nm. After being coated with the lubricant, the DTR medium was incorporated into an HDD drive and evaluated.

Consequently, the read/write head positioning accuracy was 6 nm, and the on-track BER was 10 to the −5th power.

Example 8

Formation Example of BPM

A BPM was manufactured following the same procedures as in Example 6 except that the pattern shown in FIG. 3 was written by EB lithography. The bit size of the manufactured BPM was 35 nm×15 nm. Since the BER of the BPM cannot be defined, comparison was performed using the signal amplitude intensity. The BPM was magnetized in one direction and incorporated into a drive, and a reproduced waveform was observed. As a consequence, a signal amplitude intensity of 200 mV was obtained. The read/write head positioning accuracy was 6 nm. This reveals that the use of the master of the embodiment makes it possible to manufacture a BPM having finer patterns by the same manufacturing method as that of the DTR medium.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electroforming master comprising:
   a substrate including a conductive region on at least one major surface, and a projecting pattern layer which is formed on the conductive region of the major surface in accordance with information for positioning a read/write head and one of a recording track and a recording bit,
   wherein the projecting pattern layer comprises a material selected from the group comprising a microcrystalline material, a polycrystalline material, an amorphous material, and oxides of the microcrystalline material, the polycrystalline material, and the amorphous material, and has a thickness of 2 to 50 nm.

2. The master of claim 1, wherein the projecting pattern layer comprises at least one material selected from the group comprising microcrystalline, polycrystalline, and amorphous materials of Si and Ti, and oxides of the microcrystalline, polycrystalline, and amorphous materials of Si and Ti.

3. The master of claim 1, wherein the conductive region comprises a material formed on one major surface of the substrate that is selected from the group comprising platinum, gold, palladium, ruthenium, copper, and alloys of platinum, gold, palladium, ruthenium, and copper.

4. The master of claim 1, wherein the conductive region comprises a material formed on one major surface of the substrate that is selected from the group comprising iron, cobalt, nickel, titanium, tantalum, tungsten, and alloys of iron, cobalt, nickel, titanium, tantalum, and tungsten.

5. An electroforming master manufacturing method comprising:
   preparing a substrate including a conductive region on at least one major surface, and forming, on the conductive region of the major surface, a pattern formation layer made of a material selected from the group comprising a microcrystalline material, a polycrystalline material, and an amorphous material, and oxides of the microcrystalline material, the polycrystalline material, and the amorphous material;
   forming a mask layer on the pattern formation layer;
   coating the mask layer with an electron beam (EB) lithography resist having etching selectivity lower than that of the mask layer, thereby forming an EB lithography resist coating layer;
   writing information for positioning a read/write head and one of a recording track and a recording bit, on the EB lithography resist coating layer by using an EB lithography apparatus, and developing the information, thereby forming an EB lithography resist pattern;
   forming a mask pattern by etching the mask layer via the EB lithography resist pattern;
   forming a projecting pattern having a thickness of 2 to 50 nm by partially etching away the pattern formation layer via the mask pattern; and
   removing the EB lithography resist pattern and the mask pattern by ashing.

6. The method of claim 5, wherein the mask layer comprises a stack including a carbon mask layer formed on the pattern formation layer and a silicon mask layer formed on the carbon mask layer.

* * * * *